(12) United States Patent
Rhodes (10) Patent No.: US 6,451,488 B1
(45) Date of Patent: Sep. 17, 2002

(54) SINGLE-LEVEL MASKING WITH PARTIAL USE OF ATTENUATED PHASE-SHIFT TECHNOLOGY

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/652,774

(22) Filed: Aug. 31, 2000

(51) Int. Cl.[7] .............................. G03F 9/00; G03C 5/00
(52) U.S. Cl. ........................................... 430/5; 430/311
(58) Field of Search ..................... 430/5, 322, 323, 430/324, 394; 716/19, 21

(56) References Cited

U.S. PATENT DOCUMENTS

| | | |
|---|---|---|
| 5,376,483 A | 12/1994 | Rolfson |
| 5,468,578 A | 11/1995 | Rolfson |
| 5,766,829 A | 6/1998 | Cathey, Jr. et al. |
| 5,888,678 A | 3/1999 | Tzu et al. |
| 6,077,633 A | 6/2000 | Lin et al. |
| 6,261,725 B1 * | 7/2001 | Tzu et al. ...................... 430/5 |

* cited by examiner

*Primary Examiner*—S. Rosasco
(74) *Attorney, Agent, or Firm*—Fogg Slifer Polglaze Leffert & Jay P.A.

(57) ABSTRACT

A photolithographic mask includes a substrate having a single masking layer from which are formed regions of phase shifting between the substrate and the masking layer and regions of non-phase shifting between the substrate and the masking layer. The photolithographic mask is formed using a single masking layer with binary mask technology in one set of regions and attenuated phase shift lithography in a second set of regions.

43 Claims, 7 Drawing Sheets

SINGLE-LEVEL MASKING WITH PARTIAL USE OF ATTENUATED PHASE-SHIFT TECHNOLOGY

FIELD

The present invention relates generally to microlithographic mask structures and methods, and more particularly to mask-making for attenuated phase-shift lithography.

BACKGROUND

A key component of the vast and continuing progress in integrated circuits has been the ability to pattern ever smaller dimensions. These extremely small dimensions are not patterned with visible light. Instead, shorter-wavelength radiation, such as ultraviolet light, x-rays, or electron or ion beams is used in a lithography process. Electron beam and ion beam lithography produce extremely small dimensions, much smaller than is currently required for integrated circuit manufacture, but these methods can only write one pixel at a time. They are unsuitable for rapid volume manufacture.

For transferring a formed pattern onto an integrated circuit, an imaging method is used. The starting point is a "reticle," which already contains a magnified version of the pattern that is desired to be reproduced on the chip. In a machine called a "stepper," the reticle is illuminated from behind by a condenser system, typically using ultraviolet light, and the image of the reticle's pattern is projected by a lens onto a layer of photoresist material on the chip. This optical patterning step is known as "photolithography" or "microlithography." Typically, each exposure of the photosensitive material projects the reticle pattern onto only a portion of the wafer. After each exposure, the stepper "steps" the wafer into a new position for a new exposure. The photoresist may be positive or negative. For a positive photoresist, regions which have electromagnetic radiation applied dissolve upon application of a developer solution, while regions which are not exposed do not dissolve in the developer. With a negative photoresist, the reverse occurs. lithography is so important to semiconductor fabrication that improvements in the resolution of the photoresist patterning are constantly necessary. However, modern stepper systems already operate so close to the fundamental limits of physical law that further improvements are very difficult.

Figure 1:
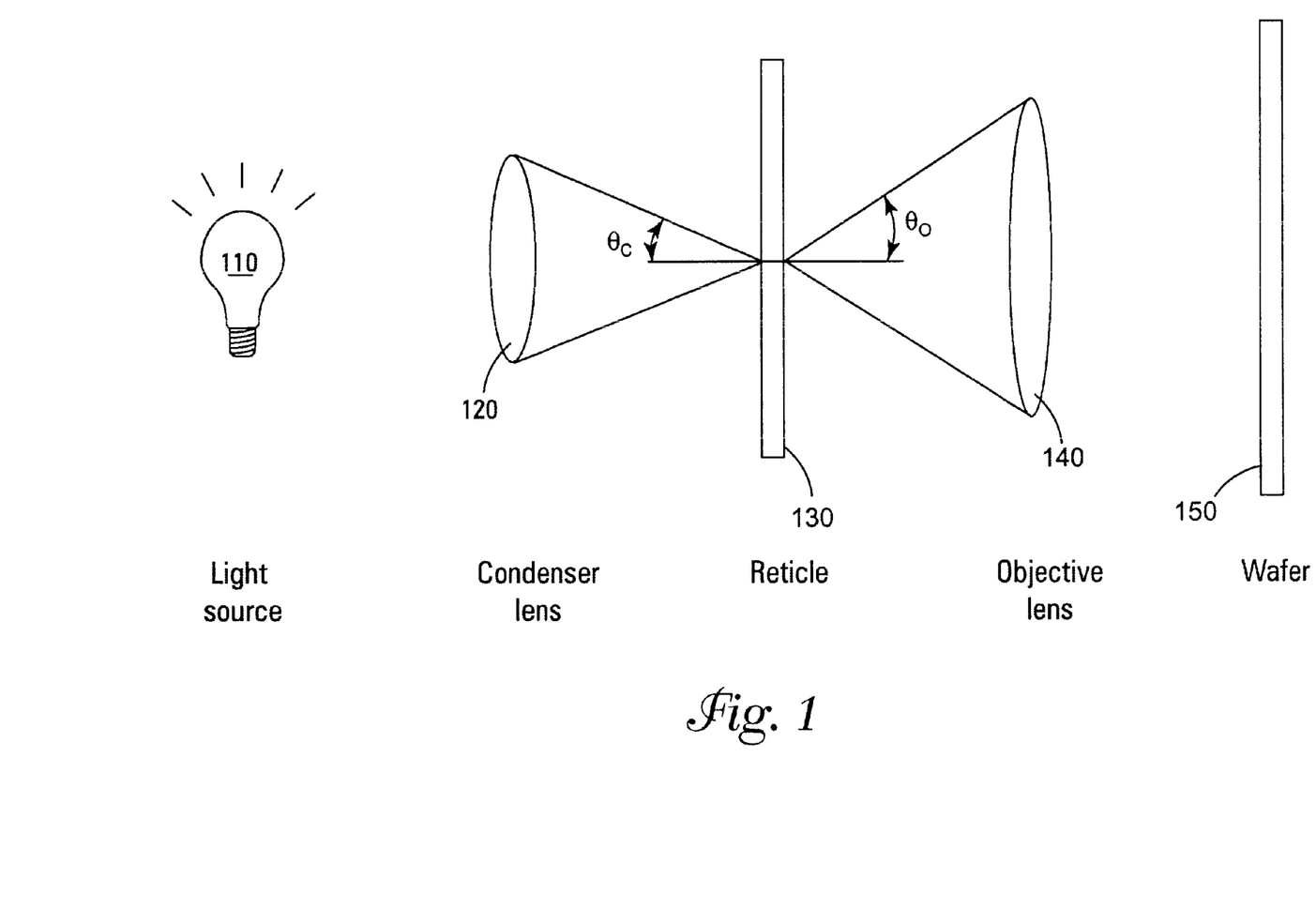
FIG. 1 is a schematic view of a typical main optical train in a modern stepper.

FIG. 1 is a schematic view of a typical main optical train in a modern stepper. Many key elements, such as autofocusing, positioning, vibration control, and cooling, are omitted in this simplified drawing. Light from an ultraviolet source 110 is captured by a condenser system 120 (shown here, for simplicity, as a simple lens) to provide backlighting of a reticle 130. An objective lens system 140 which may contain dozens of lens elements images the reticle's pattern onto a wafer 150.

Figure 2:
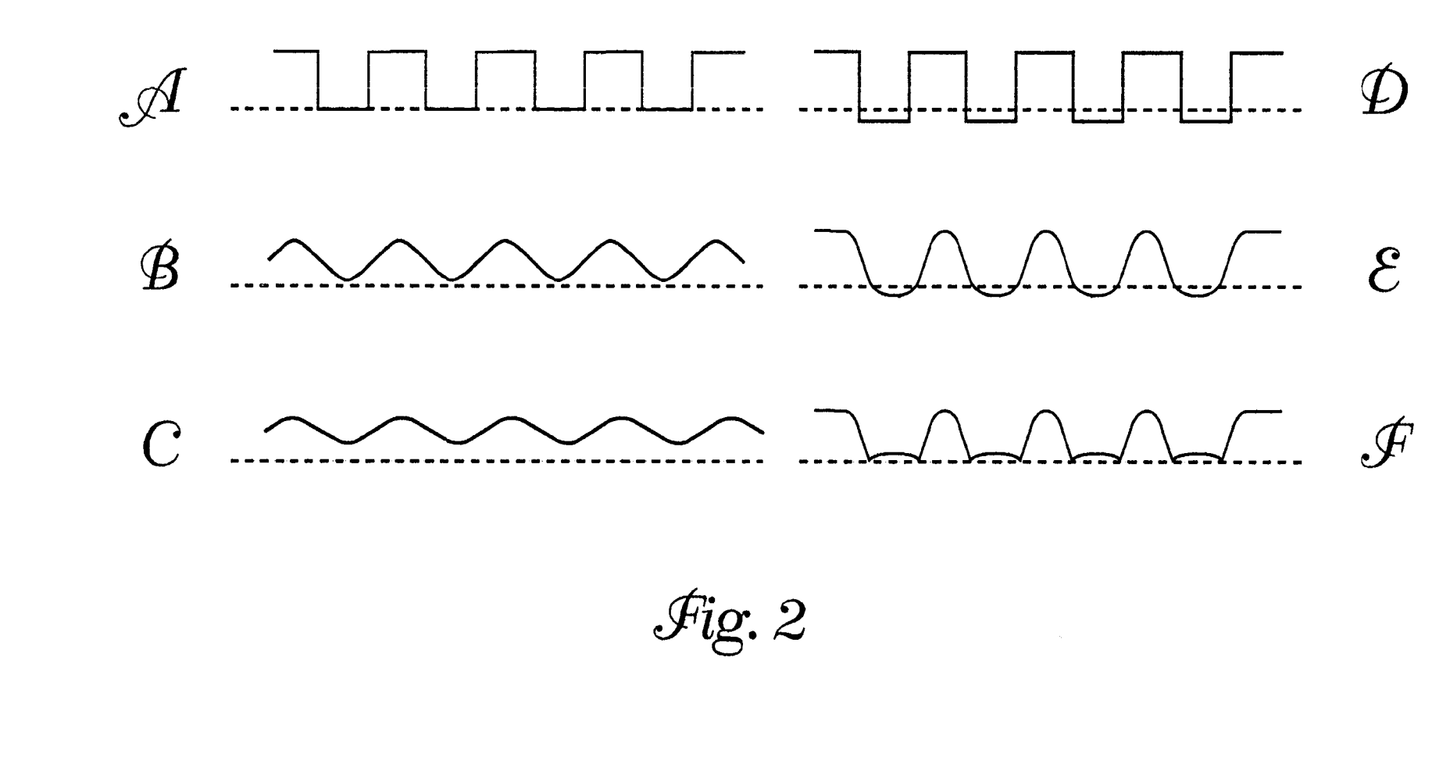
FIG. 2 illustrates a black/white pattern on a reticle with and without the use of phase-shifting techniques.

The dimensions used are so close to the absolute physical limits of resolution that much of the black/white contrast of the pattern is lost, even when alignment and focusing are perfect, and even if the lens optics were perfect (which, in practice, they never are). The three traces on the left side of FIG. 2 show how a black/white pattern in the reticle is imaged onto the photoresist. (For simplicity, this drawing is dimensioned as if there were no magnification in the stepper lens, although, in practice, the reticle would typically be larger by a factor of 4:1 or so.) Suppose, for example, that the reticle is illuminated by ultraviolet light at a wavelength of 365 nm ("i-line"), and the center-to-center spacing of lines in the desired pattern is 500 nm (i.e., lines and spaces are 0.25 micron wide); then, the image will be severely diffraction-limited, as shown.

Trace A on the left side of FIG. 2 shows the distribution of electric field strength (at optical frequencies) at the surface of the reticle. (The mask pattern is assumed to be a conventional one where every portion of the pattern is all opaque or all transparent, i.e., this is a "binary" mask.) As shown in Trace B, the best imaging optics can image this binary pattern only as a gentle modulation of the electric field at the surface of the photoresist. The incident power density, as shown in Trace C, is proportional to the square of the electric field. The square of a function is always sharper than the function itself. Image contrast is limited even though the power density is proportional to the square of the electric field. Thus, the black/white pattern of the binary reticle is imaged as merely a gray-on-gray pattern on the photoresist.

Figure 3:
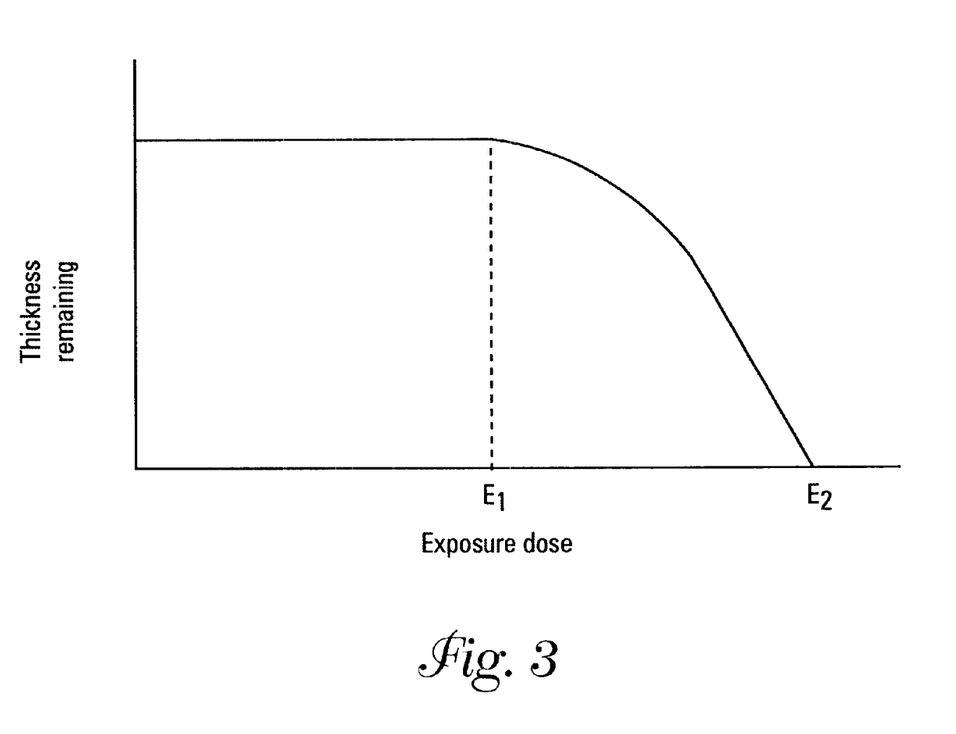
FIG. 3 is a typical photoresist response profile.

Conventionally, photoresist chemistry is optimized to discriminate between the brighter and darker intensities. FIG. 3 shows a typical photoresist response profile. Photoresist locations which have received an integrated dose (per unit area) of E1 or less will be unaffected, but a dose of E2 or more will cause the photoresist to be cleared. The slope of this curve at doses below E2 is an important measure of sensitivity.

One way to push the limits of resolution farther is to use interference techniques to increase the range of intensities imaged onto the surface of the photoresist. There are several ways to do this One preferred way is Attenuated Phase-Shift Lithography, or APSL. APSL techniques have two notable differences from conventional binary masks. First, the masking material is not fully opaque but is made slightly transmissive. Second, the thickness of the clear substrate, in the bare areas between the lines of the masking material, is adjusted by selective etching to create a phase shift of about 180 degrees, at the primary wavelength used for imaging, with respect to the light which passes through the masking material. This phase shift creates destructive interference: light which diffracts from the open areas into the dark areas will interfere destructively with light passing through the masking material, so that the intensity will actually pass through zero between a bright area and a dark area.

The three traces on the right side of FIG. 2 show how phase-shifting methods achieve an improvement over the conventional binary mask. Trace D in FIG. 2 shows the distribution of electric field strength at the surface of the APSL reticle. The field strength is negative, rather than zero, at the dark parts of the reticle. This is due to the phase reversal between the lines and spaces of the reticle. Trace E shows how the same imaging optics would translate the field distribution into a field distribution at the surface of the photoresist. Just as in Trace B, the distribution seen in Trace E has been smoothed out greatly by the imaging optics. However, Trace E, unlike Trace B, includes negative portions. Even though the negative portions of Trace E are narrower than the negative portions of Trace D, the field strength passes through zero near each edge, and the power density of Trace F also hits zero near each edge. As may be seen by comparing Traces C and F, this results in a great improvement in contrast.

Every type of phase-shift masking has its limitations. For example, phase-shift lithography can be particularly useful in areas which have very regular layouts, such as arrays or subarrays of memory cells, since the pattern can be modified as needed to achieve the best possible imaging performance. However, locations which have random layout, or which have very sparse images, may do better with non-phase-shift lithography.

Phase shift reticles produce images with improved resolution and depth of focus primarily for patterns that are repeating as one finds in an array. To accomplish this, the stepper illumination conditions (numerical apertures, off-axis, on-axis, quadrupole, and the like) are optimized to provide the best depth of focus and resolution for the array. Outside the array periphery, the pattern is not repeating and the resolution or depth of focus in the periphery can be degraded due to the phase shift reticle. So there is a need to develop a simple, manufacturable reticle technology that produces a phase shift patterning capability in one part of the reticle but yet produces a non-phase shift patterning capability in another part of the reticle.

SUMMARY

The present application, in various embodiments, discloses a photolithography masking technology in which a single semi-opaque patterned layer is used to provide both phase-shift and conventional lithography on the same integrated circuit. This is accomplished by patterning the transmissive substrate so that in some areas, the etched substrate pattern provides a phase-shift which creates destructive interference relations, and in other areas, the etched substrate pattern creates a phase-shift which does not provide these destructive interference relations.

In one embodiment, a method of forming a lithographic mask includes patterning a mask layer having a periphery pattern and an array pattern on a substrate, etching the periphery pattern and the array pattern to create a first region with zero phase shift between the mask layer and the substrate, and etching the array pattern to create a second region with a different phase shift between the mask layer and the substrate.

In another embodiment, a photolithographic mask includes a transmissive substrate having a first region and a second region and a mask layer etched from a mask material in a fine line pattern. The substrate is recessed in the first region to a first depth and recessed in the second region to a second depth different from the first depth to provide no phase shifting between the mask layer and the substrate in the first region and to provide non-zero phase shifting between the mask layer and the substrate in the second region.

Other embodiments are described and claimed.

DETAILED DESCRIPTION

In the following detailed description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

In this description, the terms "electromagnetic radiation" and "imaging radiation" are intended to cover all radiation which is transmitted via photons, ions, electrons, or other subatomic, atomic, or molecular particles including, but not limited to, visible, infrared, and ultraviolet radiation. Further, the term "closely adjacent" is used to indicate the spacing of juxtaposed mask openings which are spaced a distance that is close enough such that the intensity of the electromagnetic radiation applied to the unaffected space becomes relatively large compared with the intensity of the electromagnetic radiation applied to the electromagnetic radiation application regions (hereinafter referred to as "EAR"s). This distance will typically be related to the resolution of the lithography tool, which is defined as:

$$r = \frac{\kappa_1 \lambda}{NA}, \quad (1)$$

where $\lambda$ is a wavelength of the electromagnetic radiation used in the exposure, NA is a numerical aperture of the optical system, and $\kappa_1$ is an Aries factor which relates to the limit of diffraction and which determines how aggressively the photolithography is being pushed. Typically, $\kappa_1$ ranges between 0.5 and 0.9. The term "pushing" is defined as the resolution which is being attempted by the photolithographic process. In the present instance, the distance may be expressed as:

$$\text{space} < \frac{0.8\lambda}{NA}, \quad (2)$$

where $\lambda$ is the exposure wavelength, and NA is the numerical aperture of the tool.

Figure 4:
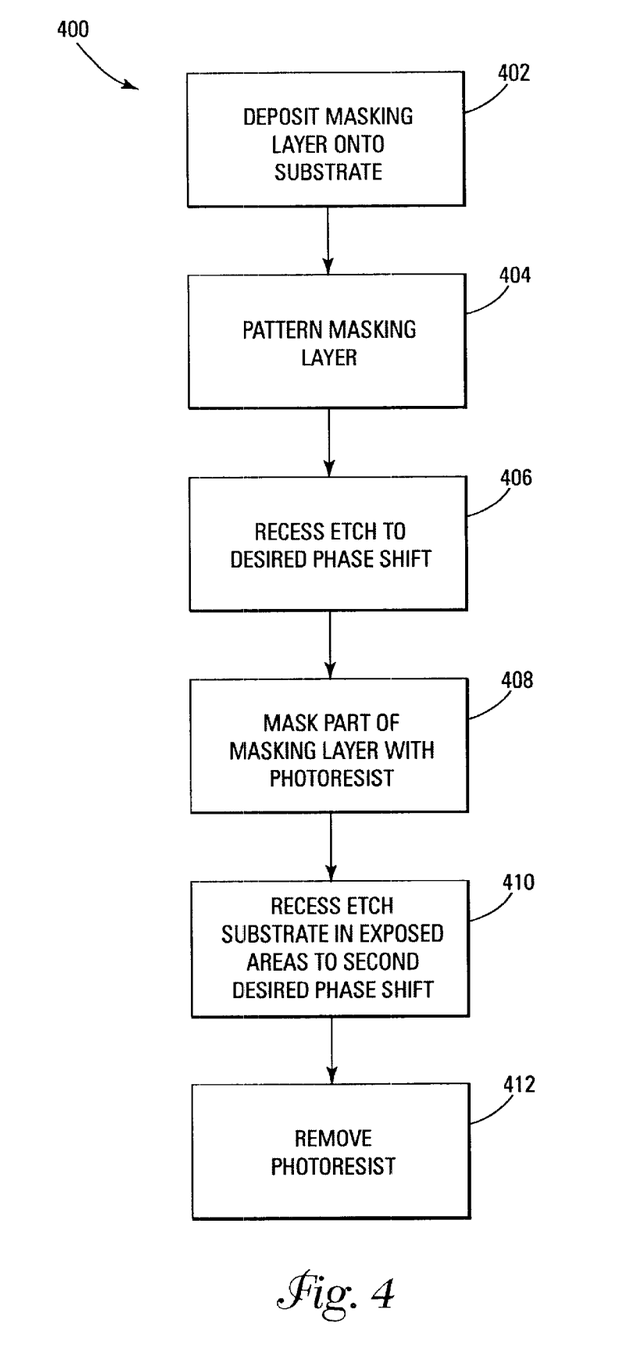
FIG. 4 is a flow chart diagram of one embodiment of a method of fabricating a lithographic mask.

One embodiment of a method 400 for forming a lithographic mask is shown in FIG. 4. The method of the present disclosure will be described with reference to the flow chart of FIG. 4. Method 400 comprises providing a partially transmissive substrate plate and depositing a masking layer thereon in block 402. In one embodiment, the transmissive substrate 101 is quartz (silicon dioxide). Alternatively, other materials such as silicon oxynitride and the like that are transmissive at the optical illumination wavelength are used. The masking layer is in one embodiment a partially transmissive material, for example, chromium. Comparable alloys, or oxides or oxynitrides such as CrO, CrON, MoSiO, and MoSiON and the like are also acceptable for use without departing from the scope of the present invention. The thickness of the masking layer is chosen to achieve a desired opacity thereof. In one embodiment for example, a masking layer thickness is chosen to result in approximately 4%–10% transmissivity at the wavelength used for exposure. The desired opacity is limited by the photoresist response curve. The light transmitted must be kept beneath a certain level so as to not expose the photoresist in dark areas of the pattern.

The masking layer is patterned and etched in block 404 to a desired pattern. In one embodiment, the masking layer is patterned and etched in a fine-line patterning. This fine-line patterning is in one embodiment performed by conventional e-beam lithography, but other methods, such as laser write, focused ion beam, or photolithography, are used in other embodiments. The choice of technology for fine-line patterning is somewhat dependent on whether the reticle is larger than the desired dimensions of the pattern when projected onto the chip. If the reticle is larger, for example, by a 5:1 ratio, then reticles are capable of reproduction from a master copy by photolithographic methods. However, if the reticle has 1:1 dimensions, it is necessary to use e-beam lithography or similar methods to avoid pattern degradation.

When using e-beam lithography, in one embodiment, the reticle is coated with an e-beam resist written with an electron beam developed and used to mask an etch which removes the masking layer wherever the e-beam resist is missing after development.

The patterned e-beam resist is used in one embodiment to mask a recess etch in block 406, which adjusts the thickness of the substrate in selected areas until light passing through the masking layer and substrate is in phase with light passing through the substrate recesses between lines of the masking layer. (The relevant phase relations are measured at the optical wavelength which will be used for exposing wafers.) This recess etch uses in one embodiment a fluorine-based chemistry to etch recesses into the substrate.

A large-geometry photoresist pattern is applied to open only a first area of the patterned masking layer in block 408. In one embodiment, this patterning process uses a much lower resolution than the first patterning process.

Another etch is then performed in block 410 to form deeper recesses in the transmissive substrate where the substrate is exposed by the patterned masking layer within the first area until the optical path delta in this first region is out-of-phase with the optical path delta in a second region. In one embodiment, the optical path delta with respect to light passing through the masking is 180 degrees. In other embodiments, different phase differences between light passing through the first region and the second region are formed by varying the etching depths and masking layer depths. Any optical path delta of greater than 90 degrees provides some benefit as discussed above.

After the etch of block 410, the photoresist coat is removed in block 412 to leave a lithographic mask containing at least one region suitable for phase-shifted lithography and at least one region suitable for non-phase-shifted lithography on the same reticle. In one embodiment, the phase-shifted lithography region is in the array of the reticle and the non-phase shifted lithography is in the periphery region outside the array.

Figure 4A:
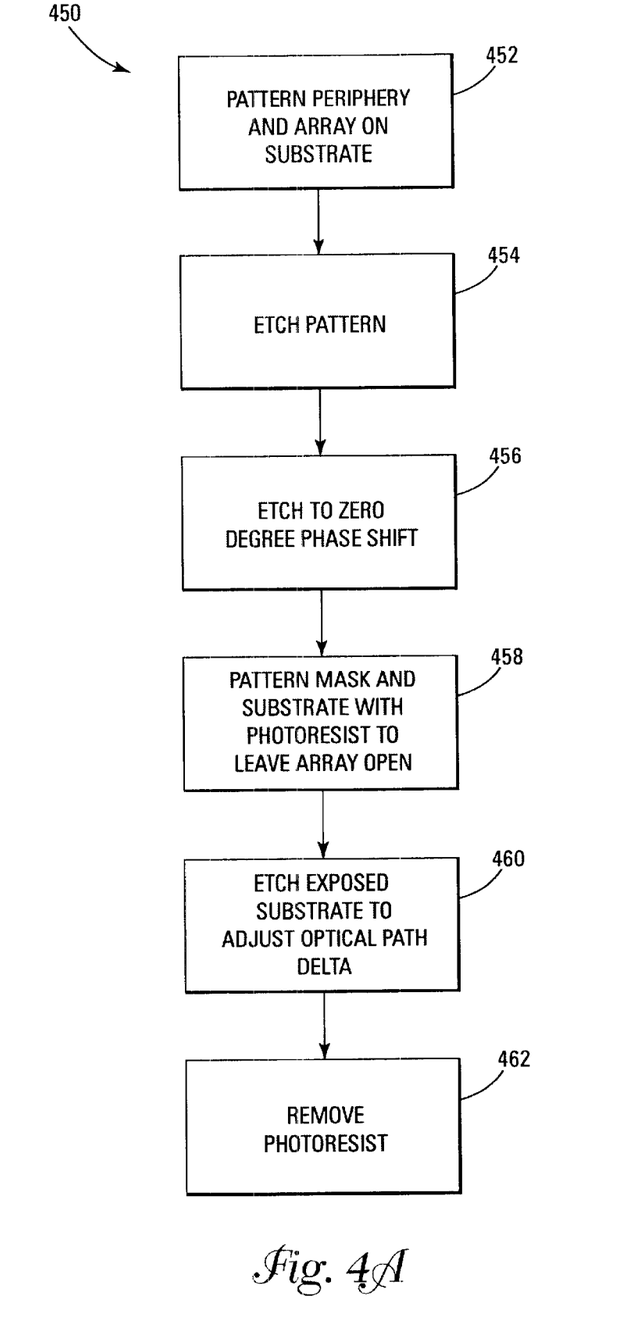
FIG. 4A is a flow chart diagram of another embodiment of a method of fabricating a lithographic mask.

Another embodiment of a method 450 of forming a reticle comprises using a chrome plating mask with partially transmissive chrome on a substrate to pattern both a periphery and an array in block 452, and etching the chrome pattern in block 454. In block 456, the substrate is etched so that the phase shift between the transmitted light through the chrome and the non-chrome or clear regions is in phase, that is to say has a zero degree phase shift therebetween. In block 458, the chrome layer and substrate are patterned with a photoresist so that only the array area and not the periphery is open. In block 460, the exposed substrate areas of the array are etched to adjust the optical path delta, or phase shift between transmitted light, to a desired phase difference, in one embodiment 180 degrees. The photoresist is removed in block 462.

Figure 5:
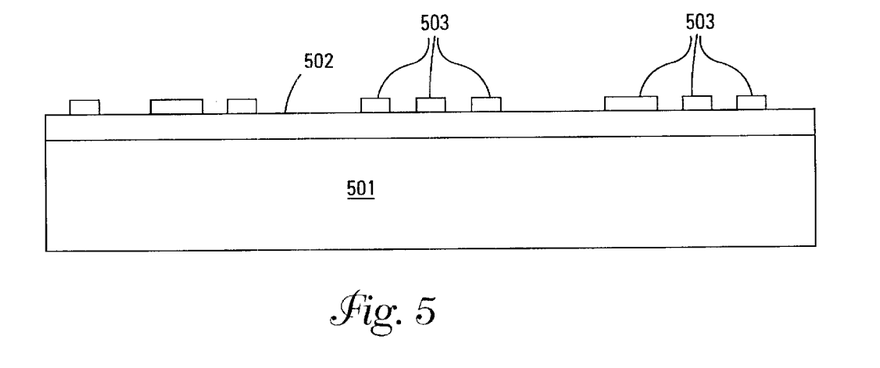
FIGS. 5, 6, 7 and 8 are elevation views of one embodiment of a lithographic mask at various stages of fabrication.

In one embodiment, the transmissivity of the chrome plate is approximately 4% to 10%. In another embodiment, the transmissivity is approximately 5%. In other embodiments, different masking layer substances are used, including but not limited to alloys, oxides, or oxynitrides of various metals including Chromium and Molybdenum as described above. FIGS. 5, 6, 7 and 8 show a lithographic mask and reticle 500 in various stages of formation. In FIG. 5, a substrate 501 has formed thereon a layer of masking material 502. In one embodiment, the substrate 501 is quartz and the masking material 502 is chrome. A resist pattern is 503 formed on the masking layer 502 in a desired pattern for the array and periphery.

Figure 6:
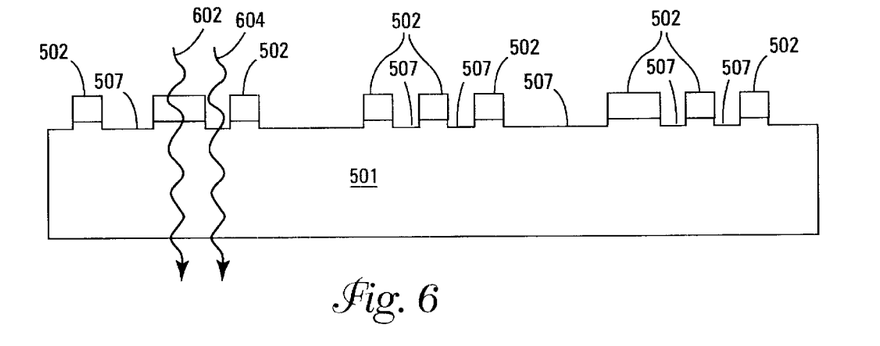

FIG. 6 shows the partially fabricated lithographic mask and reticle 500 after the masking layer 502 has been patterned and the resist 503 removed. Also, the transmissive substrate 501 has been partially etched to a different depth than the original substrate 501 where exposed by the spaces in patterned masking layer 502 such that the optical path delta for light passing through masking layer 502 and recesses 507 in substrate 501 is in-phase with light passing through the transmissive substrate 101 alone, as indicated by light ray traces 602 and 604.

Figure 7:
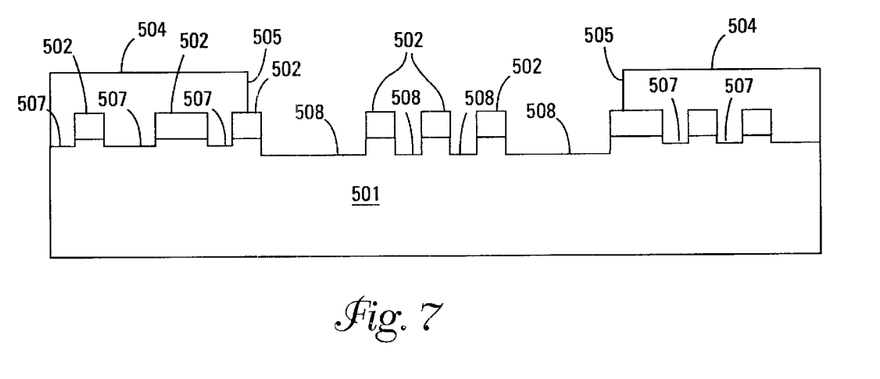

FIG. 7 shows the partially fabricated lithographic mask and reticle 500 after a second resist coat 504 has been formed leaving a first region 550 open while covering second regions 560. Furthermore, the partially fabricated lithographic mask shown in FIG. 4 has had recesses 507 etched to a still deeper depth 508 wherever the substrate 501 (in region 550) is not covered by the masking layer 502. The depth of the recesses 508 is selected to adjust the optical path delta for areas in the first region 550 so that light transmitted through the masking layer 502 is out of phase with light entering through the recesses 508. In one embodiment, the recess 508 depth is formed so that the phase shift between light passing through the substrate 501 via recesses 508 and through masking layer 502 is 180 degrees, as indicated by light ray traces 802 and 804 in FIG. 8.

In FIG. 7, note that the edge 505 of the resist 504 in one embodiment falls on the masking layer 502. This avoids problems with etching a step into the substrate. To achieve this, a dark ring (i.e., a closed loop in masking layer 502) separates the phase-shifting mask areas 560 from the binary mask areas 550 in one embodiment.

Figure 8:
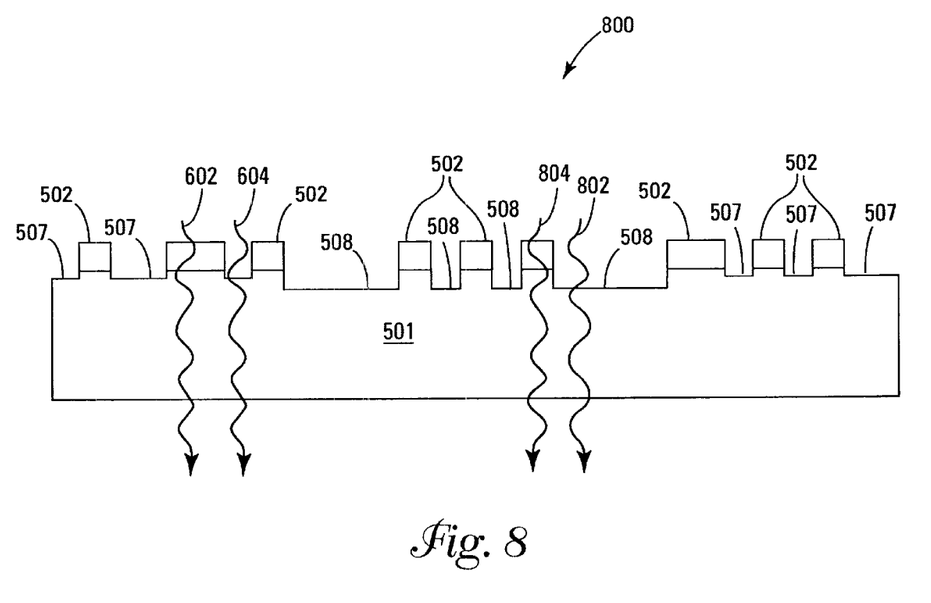

FIG. 8 shows a lithographic mask 801 after the second resist coat 504 has been removed. The first region 550 has an optical path delta through the masking layer 502 that is out of phase with respect to the optical path delta through the recesses 508. The second regions 560 have an optical path delta through the masking layer 502 that is in phase with respect to the optical path delta through the recesses 507. Thus, regions 560 provide 0 degrees phase-shift which patterns similar to a conventional binary mask, whereas regions 550 provide an APSL mask. This is achieved with a uniform masking layer 502 and without any need to etch this thin layer twice, and is accomplished with a non-critical patterning 504. In another embodiment, a reticle is formed with different etching depths to set the phase-shift in the exposed area to 0 degrees, after initially patterning all phase-shifts to 180 degrees.

As will be recognized by those skilled in the art, the various embodiments described in the present application can be modified and varied over a tremendous range of applications and, accordingly, the scope of patented subject matter is not limited by any of the specific exemplary teachings given.

For example, in another embodiment, the methods described above are used both with negative mask applications and with positive mask applications.

In another embodiment. the masks described above are used for lithography with various types of radiation, including, without limitation, excimer laser radiation, vacuum ultraviolet radiation, so called soft X-rays, X-rays, electron beams, and the like. The choice of transmissive substrate material and partially transmissive pattern material in these embodiments depends on the type of radiation intended to be used with that mask.

When using the mask thus generated as in these embodiments, a purely monochromatic light source is not strictly necessary. To the extent that the source includes a range of wavelengths, the phase-shifts induced by path length differences are unequal, and hence the full advantages of phase-shift lithography are realized. However, to the extent that the spread in wavelengths is small, the advantages of phase-shift lithography are still partially realized.

The methods and structures described herein are generally independent of the particular wavelength to be used for patterning integrated circuits. In one embodiment, the light source operates at a wavelength of 248 nm. In other embodiments, an i-line source or a g-line source, or excimer sources with shorter wavelengths are used. Further, the choice of substrate depends on the choice of light source. For example, at a light source wavelength of 157 nm, one choice of substrate is fluorine doped quartz.

In other embodiments, the methods described above are applied to vacuum ultraviolet or soft x-ray sources. With differing wavelengths, the thickness differences of masking layers and recess depths which produce various phase-shifts change, but the principles of the present invention are still applicable with appropriate corrections.

In yet another embodiment, the methods described above are applied for patterning with coherent light sources, such as superfluorescent excitations and the like. Sources which provide some degree of temporal coherence are useful in some optimizations for phase-shift lithography.

Still another embodiment uses patterned-retardation etch with implanted rather than deposited masks. In other words, the etch is used with a patterned implant of heavy metal ion x-ray reticles. It is still necessary to do selective etching of the substrate with respect to the fine-line pattern, which requires a very heavy implant dose and/or a very selective etch.

While e-beam direct write is contemplated as one way to generate the fine-line reticle pattern, the method of fine-line reticle patterning could be varied. The use of a patterned-retardation etch, as described above, can also be combined with focused ion beam or other reticle patterning techniques.

The various embodiments of the present invention provide less expensive fabrication methods than other lithography techniques because they require only one masking layer rather than two or more layers or masks, as in other combined phase-shift and non-phase-shift masking techniques. The use of a single masking layer decreases the number of processing steps required to manufacture integrated circuit structures. Further, the various methods allow designers more flexibility in the use of subarrays, due to the ability to use a single masking layer to provide a foundation for the formation of multiple arrays of different phase shifting. Still further, the various methods provide increased pattern fidelity in densely patterned and isolated patterns, simultaneously.

The mask fabrication process embodiments provides advantages in fabricating integrated circuits, especially in the several types of memory chips (DRAM, FLASH, SRAM, MRAM, and the like) and imager chips (CMOS, CCD) in which the array pattern is more regular than the peripheral pattern.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of forming a lithographic mask, comprising:
    patterning a mask layer having a periphery pattern and an array pattern on a substrate;
    etching the periphery pattern and the array pattern to create a first region with zero phase shift between the mask layer and the substrate; and
    etching the array pattern to create a second region with a different phase shift between the mask layer and the substrate.

2. The method of claim 1, wherein patterning the periphery pattern and the array pattern comprises applying a partially transmissive chrome to the substrate.

3. The method of claim 2, wherein the transmissivity of the chrome layer is approximately four per cent to ten per cent.

4. The method of claim 2, wherein the transmissivity of the chrome layer is approximately five per cent.

5. A method of forming a lithographic mask, comprising:
    patterning a predefined mask layer on a transmissive substrate; and
    etching first and second regions on the substrate, wherein the first and the second regions have different phase shifts between the substrate and the mask layer.

6. A method for fabricating a lithographic mask, comprising:
    forming a fine line pattern in a uniform semi-opaque masking layer on a transmissive substrate; and
    etching first areas but not second areas of the substrate with a geometry that is coarser than the fine line pattern to create a phase shift which enables destructive interference with respect to the masking layer in only one of the first or the second areas.

7. A method for forming a reticle, comprising:
    forming a reticle periphery section from a patterned masking layer on a substrate;
    forming a reticle array section from the patterned masking layer on the substrate;
    etching the substrate in the periphery section and the array section to a first depth to create zero phase shifting between the mask layer and the substrate;
    applying a photoresist layer to the periphery section; and
    etching the substrate in the array section to a second depth to create non-zero phase shifting between the mask layer and the substrate.

8. The method of claim 7, wherein the non-zero phase shifting has a value of approximately 180 degrees.

9. The method of claim 7, wherein the masking layer is formed from partially transmissive chromium.

10. The method of claim 9, wherein the partially transmissive chromium is approximately five per cent transmissive.

11. The method of claim 7, wherein the masking layer is formed from a group consisting of chromium, molybdenum, and alloys, oxides or nitrides thereof.

12. A method for forming a reticle, comprising:
    forming a mask layer on a substrate;
    forming on the substrate a first region having zero phase shifting between the mask layer and the substrate; and
    forming on the substrate a second region having non-zero phase shifting between the mask layer and the substrate.

13. The method of claim 12, wherein the mask layer is formed from a partially transmissive metal.

14. The method of claim 12, wherein the first region is formed by etching the substrate in the first region to a first depth to create zero phase shifting.

15. The method of claim 12, wherein the second region is formed by etching the substrate in the second region to a second depth to create non-zero phase shifting.

16. The method of claim 12, wherein the first region is formed by etching the substrate on the entire substrate to the first depth, and wherein the second region is formed by masking the first region with a photoresist before etching the second region to the second depth.

17. The method of claim 12, wherein the masking layer is formed from one of a group consisting of chromium, molybdenum, and alloys, oxides, or nitrides thereof.

18. A method for forming an attenuated reticle, comprising:

forming a patterned mask layer on a substrate;

forming a first set of regions on the substrate, the first set of regions having a phase-shifted image between the mask layer and the substrate; and forming a second set of regions on a different part of the substrate, the second set of regions having a non-phase shifted image between the mask layer and the substrate.

19. The method of claim 18, wherein forming the first set of regions comprises:

etching to a first depth the first portion of the substrate.

20. The method of claim 18, wherein forming the second set of regions comprises:

applying a photoresist layer to the first set of regions; and etching the substrate to the second depth in the second region.

21. A method of fabricating an integrated circuit, comprising:

forming a patterned mask layer on a substrate;

forming a first set of regions on the substrate, the first set of regions having a phase-shifted image between the mask layer and the substrate; and forming a second set of regions on a different part of the substrate, the second set of regions having a non-phase shifted image between the mask layer and the substrate.

22. A photolithographic mask, comprising:

a transmissive substrate having a first region and a second region;

a mask layer etched from a mask material in a fine line pattern;

wherein the substrate is recessed in the first region to a first depth and recessed in the second region to a second depth different from the first depth.

23. A photolithographic mask, comprising:

a transmissive substrate;

a patterned layer of a thin film masking material extending over a first set and a second set of regions of the substrate;

wherein the first set of regions have a phase shift between the masking material and the substrate; and wherein the second set of regions have no phase shift between the masking material and the substrate.

24. A reticle, comprising:

a transmissive substrate;

a single mask layer patterned on the substrate;

a first region of the reticle having a phase shifted light transmission; and a second region of the reticle having a non-phase shifted light transmission.

25. A photolithographic mask, comprising:

a transmissive substrate having a first region and a second region;

a mask layer patterned on the substrate; and wherein the first region has zero phase shifting between the mask layer and the substrate, and the second region has non-zero phase shifting between the mask layer and the substrate.

26. The photolithographic mask of claim 25, wherein the first region is formed by etching the substrate.

27. The photolithographic mask of claim 25, wherein the second region is formed by etching the substrate, masking the second region, and etching the exposed substrate again.

28. The photolithographic mask of claim 25, wherein the mask layer is formed from chrome.

29. The photolithographic mask of claim 25, wherein the mask layer is approximately five per cent transmissive.

30. A reticle, comprising:

a substrate;

a first set of regions formed on the substrate, the first set of regions having a phase-shifted image; and a second set of regions formed on a different part of the substrate, the second set of regions having a non-phase shifted image.

31. The reticle of claim 30, wherein the first set of regions comprises a first portion of a patterned mask layer and a first plurality of recesses of a first depth etched in the substrate.

32. The reticle of claim 30, wherein the second set of regions comprises a second portion of the patterned mask layer and a second plurality of recesses of a second depth etched in the substrate.

33. A photolithographic mask, comprising:

a transmissive substrate having a first region and a second region;

a mask layer etched from a mask material in a fine line pattern;

wherein the substrate is recessed in the first region to a first depth and recessed in the second region to a second depth different from the first depth.

34. A photolithographic mask, comprising:

a transmissive substrate;

a patterned layer of a thin film masking material extending over a first set and a second set of regions of the substrate;

wherein the first set of regions have a phase shift between the masking material and the substrate; and wherein the second set of regions have no phase shift between the masking material and the substrate.

35. A lithographic reticle, comprising:

a transmissive substrate;

a single mask layer patterned on the substrate;

a first region of the reticle having a phase shifted light transmission; and a second region of the reticle having a non-phase shifted light transmission.

36. An integrated circuit, comprising:

a transmissive substrate having a first set of phase shifting arrays and a second set of non-phase shifting arrays formed in a single partially transmissive mask layer.

37. The integrated circuit of claim 36, wherein the first set of arrays has a phase shift between the substrate and the mask layer of approximately 180 degrees.

38. The integrated circuit of claim 36, wherein the mask layer comprises chromium.

39. The integrated circuit of claim 38, wherein the chromium mask layer is approximately four per cent to ten per cent transmissive.

40. The integrated circuit of claim 36, wherein the mask layer is formed from one of a group consisting of chromium, molybdenum, and alloys, oxides or nitrides thereof.

41. A photolithographic mask, comprising:
- a transmissive substrate having a first set of regions and a second set of regions;
- a partially transmissive patterned mask layer on the substrate;
- wherein the substrate is recessed in the first set of regions to a first depth to create zero phase shifted light transmission through the mask layer and the substrate in the first set of regions, and wherein the substrate is recessed in the second set of regions to a second depth to create non-zero phase shifted light transmission through the mask layer and the substrate in the second set of regions.

42. The photolithographic mask of claim 41, wherein the partially transmissive mask layer is approximately four per cent to ten per cent transmissive.

43. A photolithographic mask, comprising:
- a transmissive substrate having a first set of regions and a second set of regions;
- a partially transmissive patterned mask layer on the substrate;
- wherein the substrate is recessed in the first set of regions to a first depth to create a first phase shift between light passing through the mask layer and the substrate in the first set of regions, and wherein the substrate is recessed in the second set of regions to a second depth to create a second phase shift between light passing through the mask layer and the substrate in the second set of regions.

* * * * *